(12) United States Patent
Popescu et al.

(10) Patent No.: US 8,692,114 B1
(45) Date of Patent: Apr. 8, 2014

(54) WIRING HARNESS CONDUITS SHIELD INTERCONNECT

(76) Inventors: Lucian Popescu, Santa Rosa, CA (US); Dennis L. Baney, Rohnert Park, CA (US); Scott M. Andrews, Santa Rosa, CA (US)

(*) Notice: Subject to any disclaimer, the term of this patent is extended or adjusted under 35 U.S.C. 154(b) by 139 days.

(21) Appl. No.: 13/170,051

(22) Filed: Jun. 27, 2011

Related U.S. Application Data

(60) Provisional application No. 61/358,827, filed on Jun. 25, 2010.

(51) Int. Cl.
*H01B 7/00* (2006.01)

(52) U.S. Cl.
USPC ...... 174/72 A; 174/71 R; 174/72 R; 174/74 R; 174/75 C; 174/78; 174/84 R; 174/88 C; 174/88 R; 174/91; 174/93

(58) Field of Classification Search
USPC .... 174/84 R, 88 C, 88 R, 91, 93, 71 R, 72 A, 174/72 R, 74 R, 75 C, 78
See application file for complete search history.

(56) References Cited

U.S. PATENT DOCUMENTS

| | | | | |
|---|---|---|---|---|
| 4,625,073 A * | 11/1986 | Breesch et al. | ............. | 174/72 R |
| 4,640,980 A * | 2/1987 | Batt et al. | ......................... | 174/36 |
| 5,091,604 A * | 2/1992 | Kirma | ................................ | 174/2 |
| 5,217,392 A * | 6/1993 | Hosler, Sr. | .................... | 439/585 |
| 5,347,090 A * | 9/1994 | Cerda | ......................... | 174/84 R |
| 6,160,216 A * | 12/2000 | McMahon | ....................... | 174/36 |
| 2008/0296037 A1 * | 12/2008 | Burland et al. | ................. | 174/36 |

* cited by examiner

*Primary Examiner* — Hung S Bui
*Assistant Examiner* — James Wu
(74) *Attorney, Agent, or Firm* — Craig M. Stainbrook; Stainbrook & Stainbrook, LLP

(57) ABSTRACT

A wiring harness conduit shield assembly that provides shield continuity for a transition from one or more main wire bundle conduits into two or more wire bundle conduit branches. The assembly includes a pre-branch shield sock disposed over at least one main wire bundle conduit and two or more post-branch shield socks, one each disposed around each of the wire bundle conduit branches. An interconnect ring is coaxially disposed around the main wire bundle conduit at the branching point, and the post-branch shield socks have a tail portion that is disposed over the outer surface of the interconnect ring. The pre-branch shield sock is likewise disposed over the interconnect ring, overlapping the tail portions, and a retaining ring is tightly placed over both to clamp them onto the interconnect ring in metal-to-metal contact with one another so as to create shield continuity between the pre-branch shield sock and the post-branch shield socks.

6 Claims, 4 Drawing Sheets

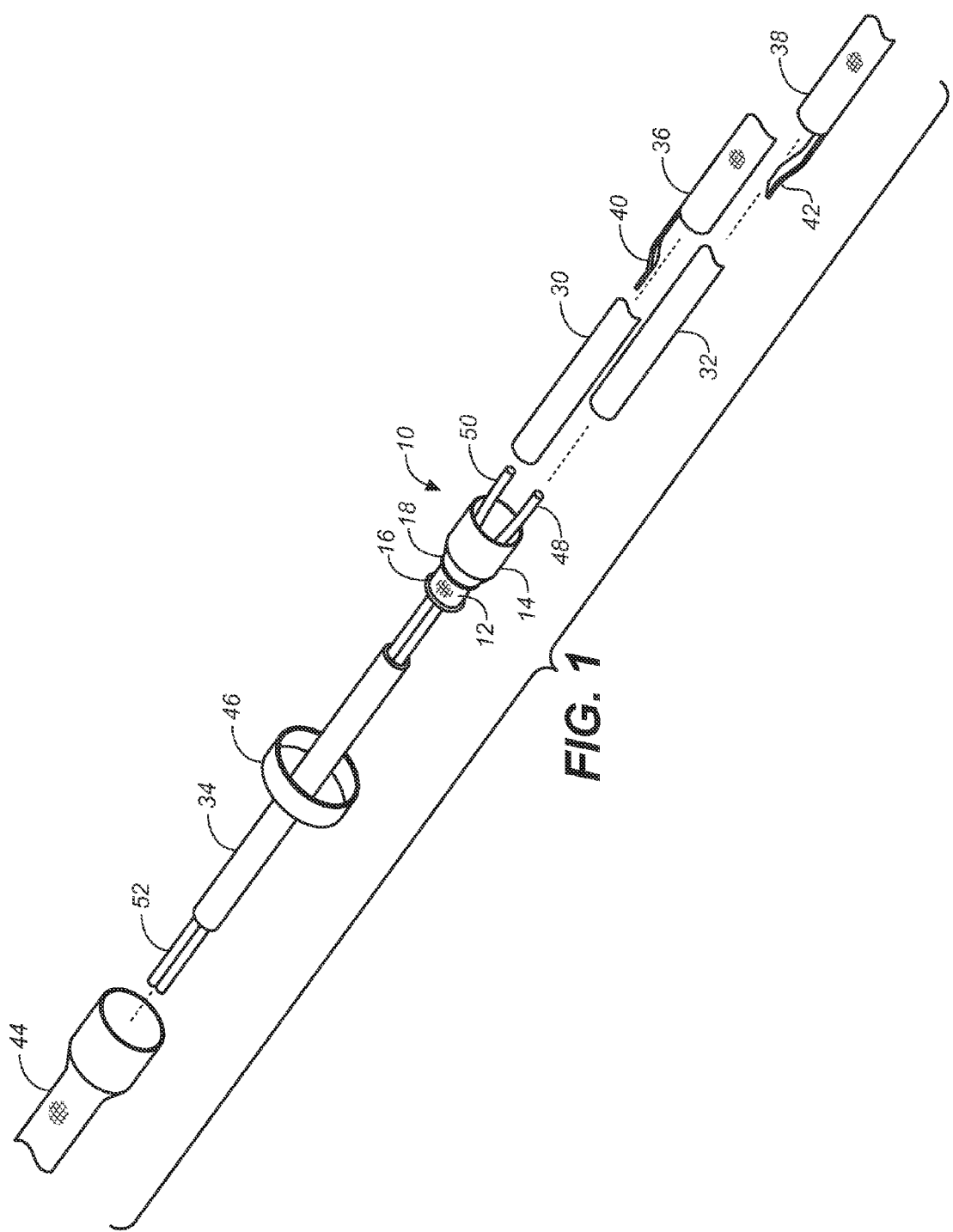

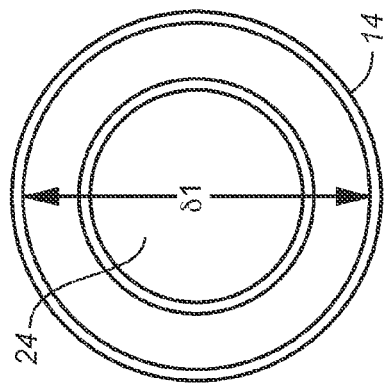
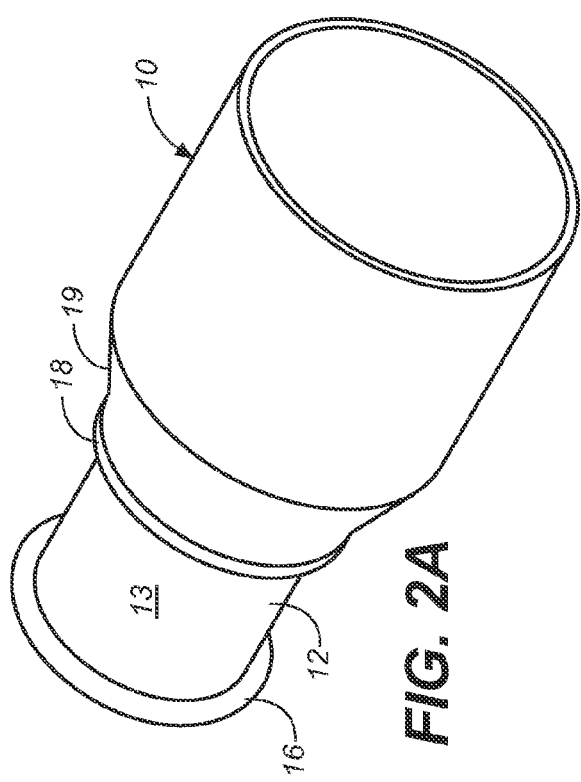
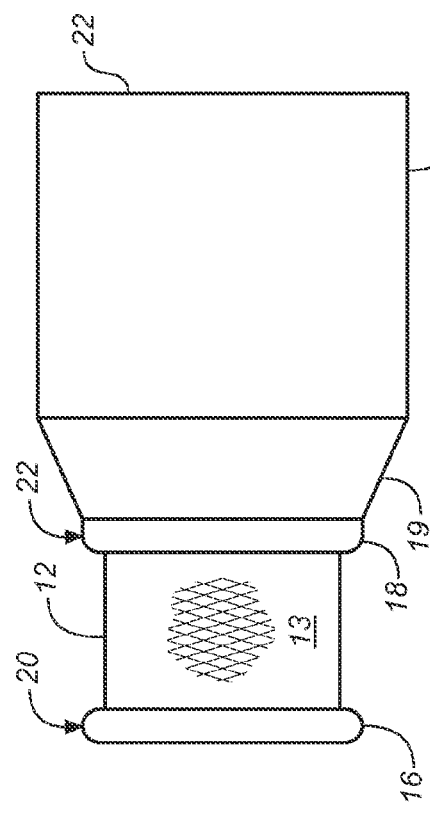
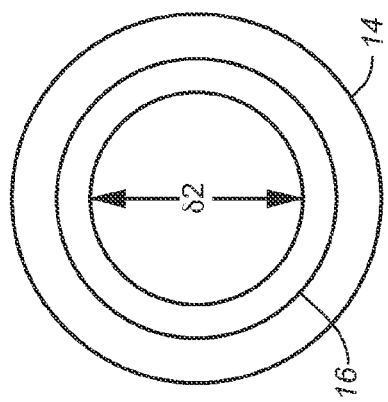

WIRING HARNESS CONDUITS SHIELD INTERCONNECT

CROSS REFERENCES TO RELATED APPLICATIONS

The present application claims the benefit of U.S. Provisional Patent Application Ser. No. 61/358,827, filed Jun. 25, 2010 (Jun. 25, 2010.)

STATEMENT REGARDING FEDERALLY SPONSORED RESEARCH OR DEVELOPMENT

Not applicable.

NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

SEQUENCE LISTING

Not applicable.

BACKGROUND OF THE INVENTION

1. Field of the Invention

The present invention relates generally to methods and apparatus for shielding branched wiring harnesses and their protective conduits so as to prevent noise caused by the penetration of interfering electromagnetic fields.

2. Background Discussion

Contemporary spacecraft, aircraft, water craft, and complex land vehicles use control, communication, and navigation systems that are critical to safety and efficient operation. These systems are largely, if not entirely, electronic, and they are typically connected and interconnected using multiple bundles of wires. This fact presents design challenges in routing and shielding the wires, as well as any conduits through which the wires are routed, as the systems identified can be quite sensitive. In many applications literally thousands of wires are routed so as to be in close proximity to other wires, wire conduits, and electronic systems. Accordingly, the wires and the signals on the wires are vulnerable to ambient EMI and RFI from neighboring wires and systems.

Because of this long appreciated problem with interference, shielding has reached a considerably high level of maturity. At present, circuits that must be protected from interference are typically provided with metallic braided shielding comprising tin- or nickel-plated copper strands. Additional insulation from interference can be provided by incorporating metallic foils in the wire bundle and/or by wrapping wire and metallic fabric around the wire bundle cover or the conduit through which the bundle is routed.

Generally, wire circuits are segregated and bundled together according to their sensitivity to EMI and RFI, and circuit noise in any given bundle is reduced by wrapping the entire bundle in a braided shield and/or routing the bundle through a conduit. However, the shield on the wire bundle or on the conduit must have electrical continuity and a low resistance connection to ground. Accordingly, at any point at which a main conduit for a main cable bundle must branch into smaller conduits for smaller wire bundles, the conventional practice is to interrupt the braided shield and to insert a metal fitting to which the individual shields of the main and branch conduits are each attached, thereby maintaining shield continuity. The ground connection is then made to the metal branch fitting.

However, the connections between shielding for the conduit branches and the main conduit at the branching point is particularly vulnerable to separation, and thus to reduced effectiveness in shielding and a potential break in the ground connection. However, because the applications call for lightweight components, it is desirable to have a robust but lightweight junction in the shielding between a main conduit and conduit branches.

BRIEF SUMMARY OF THE INVENTION

The present invention is an improved method and apparatus for shielding conduits for branched wiring harnesses so as to minimize and optimally prevent unwanted noise caused by proximate electromagnetic fields.

BRIEF DESCRIPTION OF THE SEVERAL VIEWS OF THE DRAWINGS

The invention will be understood and the various objects and advantages of the invention will become apparent when consideration is given to the following detailed description thereof. Such description makes reference to the annexed drawings wherein:

FIG. 1 is an exploded perspective view of the wiring harness and conduits shield interconnect assembly of the present invention;

FIGS. 2A-2D, viewed from the upper 12 o'clock position and moving clockwise, are, respectively, an upper perspective view, a front end view in elevation, a side view in elevation, and a rear end view in elevation of the interconnect ring;

DETAILED DESCRIPTION OF THE INVENTION

Figure 3:
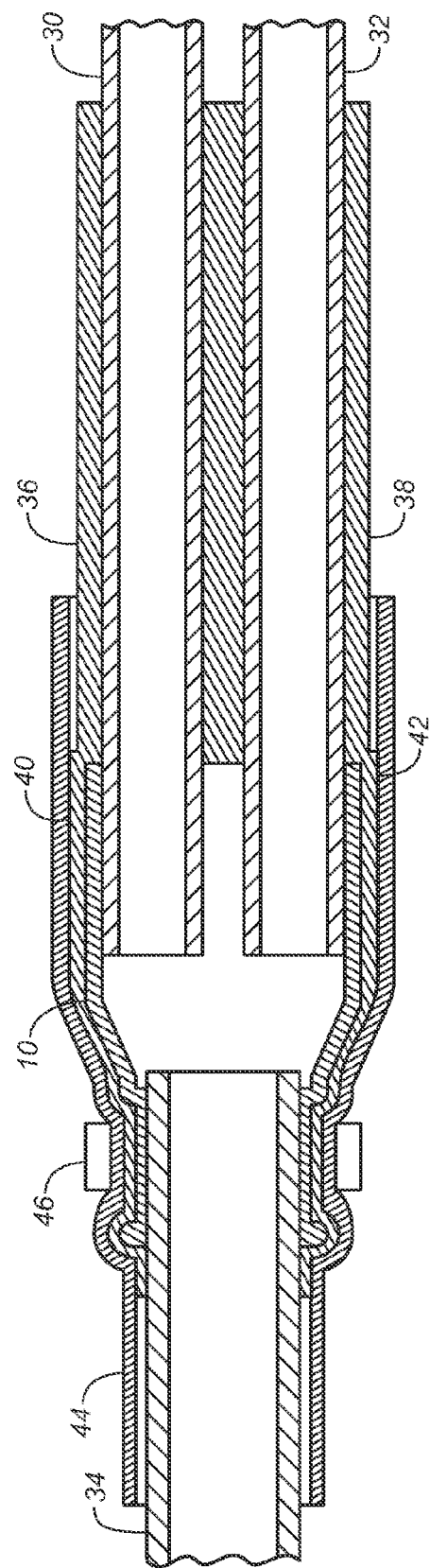
FIG. 3 is a cross-sectional side view in elevation of the inventive apparatus.

Referring to FIGS. 1 through 4C, wherein like reference numerals refer to like components in the various views, there is illustrated therein a new and improved wiring harness and conduits shield interconnect assembly. Referring first to FIG. 1, there is shown in exploded perspective view the structural and functional elements comprising the inventive apparatus, which is employed to interconnect the shields and conduits of branched wire harnesses to protect the circuits from noise caused by penetration from electromagnetic fields. The assembly includes a generally cylindrical interconnect ring 10, branch conduits 30, 32, trunk conduit 34, first and second post-branch shield socks 36, 38, pre-branch shield sock 44, and a retaining band 46. The shield socks may or may not be braided, according to the shielding and structural requirements of the intended use. The individual wire loom branches 48, 50 converge and join in the opening 24 inside interconnect ring 10 to form and thereafter continue as a common wire loom trunk 52. The interconnect ring 10 has two portions 12, 14, portion 12 having a first diameter and being knurled on its exterior surface. At each end, portion 12 includes retaining features 16, 18, which are generally rounded flanges or expansions. Portion 12 expands upwardly in a bevel 19 after retaining feature 18 to portion 14, which has an interior diameter 61 greater than the interior diameter 62 of portion 12. Conduits 30, 32 are inserted into portion 14, while trunk conduit 34 is inserted into portion 12 of interconnect ring 10.

Referring next to FIGS. 2A-2D, the interconnect ring 10 has two adjacent sections 12, 14 that are positioned on the same axes, defining the internal space 24. Portion 12 of interconnect ring 10 is positioned between the retaining features 16, 18, and is knurled on its exterior surface 13 for better contact with shield tails 40, 42 and pre-branch shield sock 44. Retaining feature 16 is coaxially disposed at the open end of portion 12, and includes rounded edges at its side 20 for chafing protection. Retaining feature 18 is coaxially disposed between portion 12 and portion 14 of interconnect ring 10, and includes a rounded edge at its side for chafing protection. Portion 14 of interconnect ring 10 is attached to or integral with retaining feature 18 at one end, and has a surface 22 at the other end that preferably includes rounded edges for chafing protection.

Referring next to FIG. 3, an end portion of each of braided shield socks 36, 38 is pulled along and against the side of the conduits and combed, thereby forming braided shield tails 40, 42. The braided shield socks 36, 38 are installed on conduits 30, 32 in contact with the side 22 of portion 14 of interconnect ring 10. The braided shield tails 40, 42 are coaxially installed around and along the outside of portions 14, 12 of interconnect ring 10. Pre-branch shield sock 44 is coaxially installed on conduit 34, atop and around shield tails 40, 42, and overlapping post-branch shield socks 36, 38. A retaining band 46 is coaxially disposed around pre-branch shield sock 44 on portion 12 of interconnect ring 10, between retaining features 16, 18, thereby securing all braided shields.

Figure 4A:
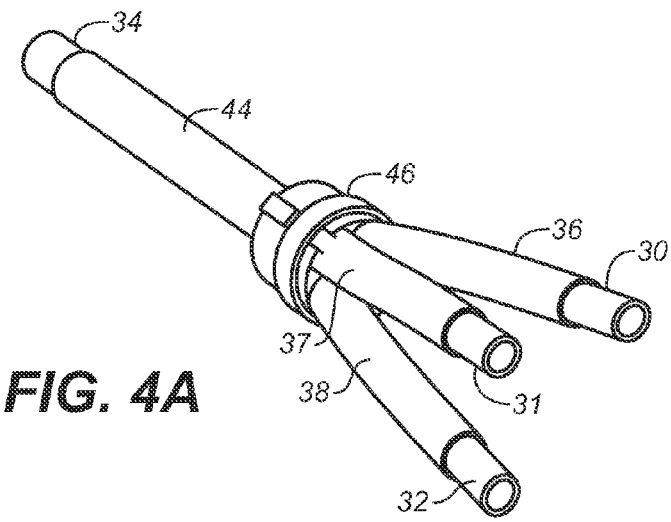
FIGS. 4A-4C show the wiring harness and conduits shield interconnect employed to branch into two and three wire loom branches, respectively.
Figure 4B:
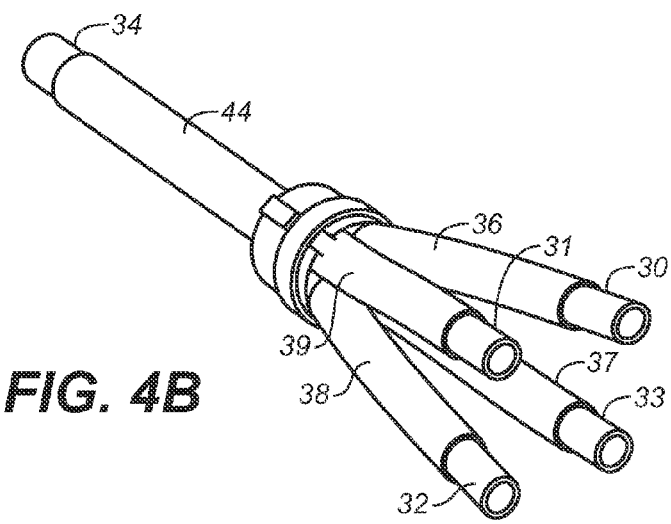
Figure 4C:
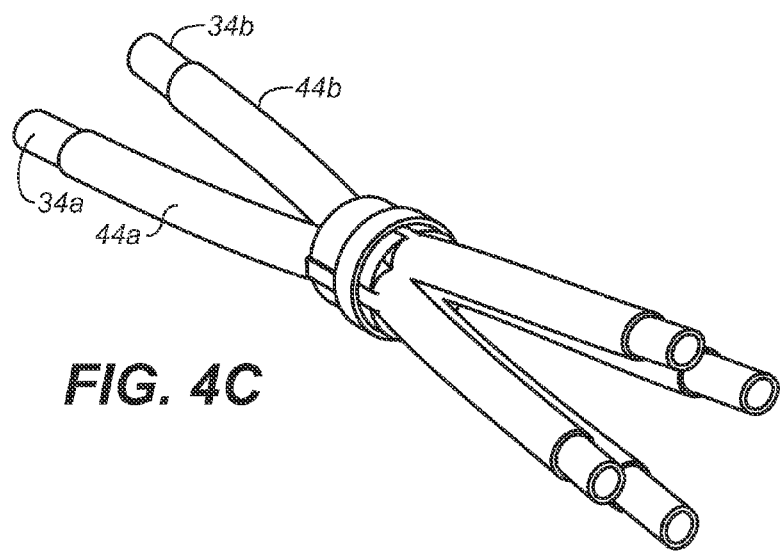

Referring finally to FIGS. 4A-4C, it is shown that portions 12 and 14 of interconnect ring 10 can be sized to accommodate and interconnect virtually an unlimited number of shielded conduits using a single interconnect ring 10. FIGS. 4A through 4C show that using the interconnect ring and assembly of the present invention, the trunk conduit 34 can branch into three branch conduits, 30, 31, 32, shielded by post-branch shield socks 36, 37, 38. (FIG. 4A), four post-branch conduits 30, 31, 32, 33, shielded by post-branch shield socks 36, 37, 38, 39 (FIG. 4B); and that the main or trunk conduit can itself be dividing into branching main conduits 34*a*, 34*b*.

According to the foregoing, it will be appreciated that in its most essential aspect, the wiring harness conduit shield assembly of the present invention provides shield continuity at a transition from one or more main wire bundle conduits into two or more wire bundle branch conduits. The assembly includes at least one pre-branch shield sock disposed around the at least one main wire bundle conduit; a plurality of post-branch shield socks, one each disposed around each of the wire bundle branch conduits, the post-branch shield socks having a tail portion extending beyond the point at which the main wire bundle branches into the wire bundle branch conduits; an interconnect ring coaxially disposed around the main wire bundle conduit at the branching point, wherein the pre-branch shield sock(s) and the tail portions of the wire bundle branch conduits are all metal or metal-plated and are disposed over the interconnect ring so as to bring the pre-branch shield sock and the post-branch shield socks into overlapping metal-to-metal contact, thereby creating shield continuity between the pre-branch shield sock and the post-branch shield socks; and a retaining band coaxially and tightly disposed around and over a portion of the overlapping portions of the pre-branch shield sock and the post-branch shield socks so as to capture and retain the portions in electrical contact with one another.

The above disclosure is sufficient to enable one of ordinary skill in the art to practice the invention. The description also provides the best mode of practicing the invention presently contemplated by the inventors. However, while there is provided herein a full and complete disclosure of the preferred embodiments of this invention, the written description and the drawings do not limit the invention to the exact construction, dimensional relationships, and operation shown and described. Various modifications, alternative constructions, changes and equivalents will readily occur to those skilled in the art and may be employed, as suitable, without departing from the true spirit and scope of the invention.

Therefore, the above description and illustrations should not be construed as limiting the scope of the invention, which is defined instead by the appended claims.

What is claimed as invention is:

1. A wiring harness conduits shield assembly for providing shield continuity where at least one main wire bundle conduit branches into two or more wire bundle conduit branches, said assembly comprising:
   at least one pre-branch shield sock disposed around the at least one main wire bundle conduit;
   a plurality of post-branch shield socks, one each disposed around each of the wire bundle branch conduits, said post-branch shield socks having a tail portion extending beyond a point at which the main wire bundle conduit branches into the wire bundle branch conduits;
   an interconnect ring coaxially disposed around the main wire bundle conduit at a branching point, wherein said at least one pre-branch shield sock and said tail portions of said wire bundle branch conduits are all metal or metal-plated and are disposed over said interconnect ring so as to bring said at least one pre-branch shield sock and said post-branch shield socks into overlapping metal-to-metal contact, thereby creating shield continuity between said at least one pre-branch shield sock and said post-branch shield socks;
   a retaining band coaxially and tightly disposed around and over a portion of the overlapping portions of said pre-branch shield sock and said post-branch shield socks so as to capture and retain a portion of each of said pre-branch shield sock and said post-branch shield socks; and
   wherein said interconnect ring is generally cylindrical and includes a first portion having a first interior diameter into which said at least one main wire bundle conduit is disposed and an exterior surface on which said pre-branch shield sock and said post-branch shield sock tail portions are disposed, said first portion having a first retaining feature disposed on one end and a second retaining feature disposed on a second end.

2. The wiring harness conduits shield assembly of claim 1, wherein said first portion of said interconnect ring expands upwardly in a bevel after said second retaining feature to a generally cylindrical second portion having an interior diameter greater than the interior diameter of said first portion, and into which post-branch conduits are inserted, and wherein said pre-branch conduit is inserted into said first portion.

3. The wiring harness conduits shield assembly of claim 1, wherein said retaining features are rounded flanges.

4. The wiring harness conduits shield assembly of claim 1, wherein an outer surface of said medial portion of said interconnect ring is knurled.

5. The wiring harness conduits shield assembly of claim 1, wherein said post-branch shield socks are combed to form said tail portions.

6. The wiring harness conduits shield assembly of claim 1, wherein said post-branch shield socks installed on said wire bundle branch conduits contact the side of at least one of said retaining features and said post-branch shield sock tail portions are wrapped in a coaxial orientation around and along an outside of a medial portion, said pre-branch shield sock is wrapped around said tail portions, and wherein the capture and retention of said pre-branch shield sock and said tail portions is provided by said retaining band installed over said pre-branch braided shield sock and said tail portions.

* * * * *